United States Patent
We et al.

(10) Patent No.: US 9,443,824 B1
(45) Date of Patent: Sep. 13, 2016

(54) CAVITY BRIDGE CONNECTION FOR DIE SPLIT ARCHITECTURE

(71) Applicant: QUALCOMM Incorporated, San Diego, CA (US)

(72) Inventors: Hong Bok We, San Diego, CA (US); Jae Sik Lee, San Diego, CA (US); Dong Wook Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/673,435

(22) Filed: Mar. 30, 2015

(51) Int. Cl.
*H01L 23/02* (2006.01)
*H01L 25/065* (2006.01)
*H01L 23/498* (2006.01)
*H01L 23/00* (2006.01)
*H01L 21/56* (2006.01)

(52) U.S. Cl.
CPC ......... *H01L 25/0652* (2013.01); *H01L 21/561* (2013.01); *H01L 23/49822* (2013.01); *H01L 24/32* (2013.01); *H01L 2224/32137* (2013.01)

(58) Field of Classification Search
CPC ........... H01L 23/5381; H01L 23/5384; H01L 24/16; H01L 24/33
See application file for complete search history.

(56) References Cited

U.S. PATENT DOCUMENTS

| | | | |
|---|---|---|---|
| 8,288,854 B2 | 10/2012 | Weng et al. | |
| 8,742,576 B2 | 6/2014 | Thacker et al. | |
| 2004/0056344 A1 | 3/2004 | Ogawa et al. | |
| 2010/0225001 A1 | 9/2010 | Hizume | |
| 2014/0174807 A1 | 6/2014 | Roy et al. | |
| 2014/0299999 A1 | 10/2014 | Hu et al. | |
| 2014/0353827 A1 | 12/2014 | Liu et al. | |
| 2014/0360767 A1 | 12/2014 | Terui et al. | |
| 2015/0028486 A1 | 1/2015 | Liu et al. | |
| 2015/0048515 A1 | 2/2015 | Zhang et al. | |
| 2016/0085899 A1* | 3/2016 | Qian | G06F 17/5077 257/774 |

OTHER PUBLICATIONS

Hirano T., et al., "Application for WLP at Positive Working Photosensitive Polybenzoxazole", Proceedings of The 15th. Biennial University/Government/Industry Microelectronics. UGIM 2003. Boise, Id, Jun. 30-Jul. 2, 2003, [University/Government/Industry Microelectronics Symposium. (UGIM)], New York, NY : IEEE, US, Jun. 30, 2003 (Jun. 30, 2003), pp. 246-249, XP010655071, DOI: 10.1109/UGIM.2003.1225736 ISBN: 978-0-7803-7972-5 abstract.
International Search Report and Written Opinion—PCT/US2016/021278—ISA/EPO—Jun. 13, 2016.

* cited by examiner

*Primary Examiner* — Hoai V Pham
(74) *Attorney, Agent, or Firm* — Seyfarth Shaw LLP

(57) ABSTRACT

An integrated circuit (IC) package structure may include a substrate. The substrate may include a semiconductor bridge having a first surface directly on a surface of the substrate that faces a first semiconductor die and a second semiconductor die. The semiconductor bridge may be disposed within a cavity extending through a photo-sensitive layer on the surface of the substrate. The semiconductor bridge may have an exposed, second surface substantially flush with the photo-sensitive layer. The first semiconductor die and the second semiconductor die are supported by the substrate and coupled together through the semiconductor bridge.

20 Claims, 17 Drawing Sheets

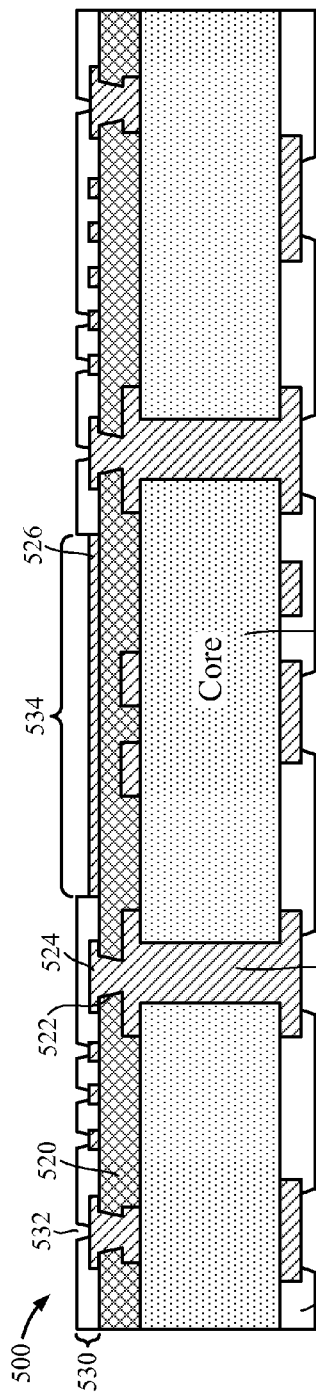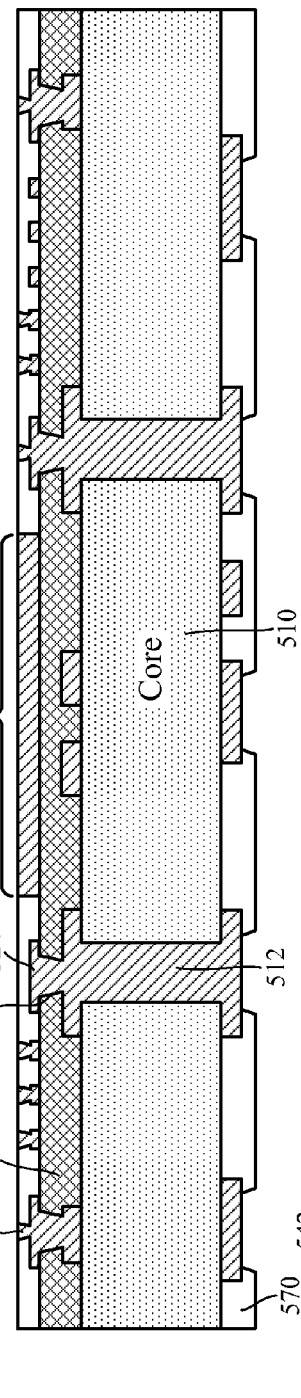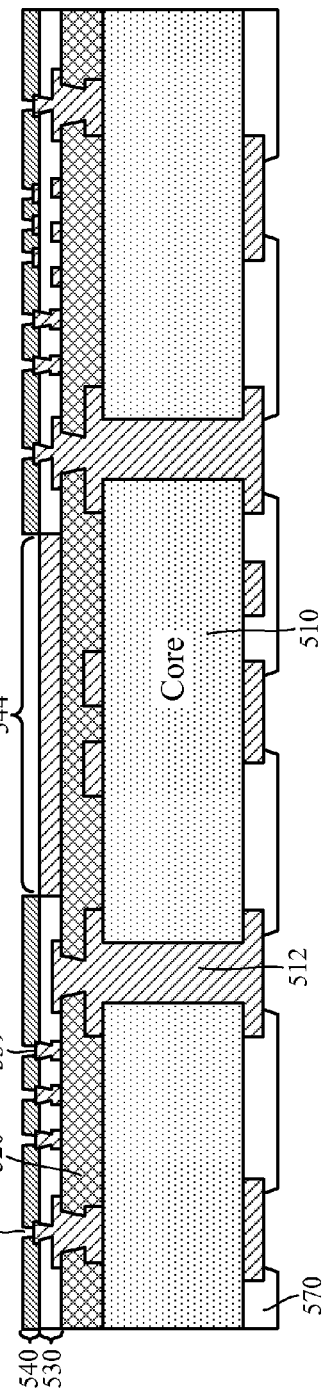

CAVITY BRIDGE CONNECTION FOR DIE SPLIT ARCHITECTURE

BACKGROUND

1. Field

Aspects of the present disclosure relate to semiconductor devices, and more particularly to a cavity bridge connection for a die split architecture.

2. Background

The process flow for semiconductor fabrication of integrated circuits (ICs) may include front-end-of-line (FEOL), middle-of-line (MOL), and back-end-of-line (BEOL) processes. The front-end-of-line processes may include wafer preparation, isolation, well formation, gate patterning, spacer, extension and source/drain implantation, silicide formation, and dual stress liner formation. The middle-of-line process may include gate contact formation. Middle-of-line layers may include, but are not limited to, middle-of-line contacts, vias or other layers within close proximity to the semiconductor device transistors or other like active devices. The back-end-of-line processes may include a series of wafer processing steps for interconnecting the semiconductor devices created during the front-end-of-line and middle-of-line processes. Successful fabrication of modern semiconductor chip products involves an interplay between the materials and the processes employed.

An interposer is a die-mounting technology in which the interposer serves as a base upon which the semiconductor dies of a system on chip (SoC) are mounted. An interposer is an example of a fan out wafer level package structure. The interposer may include wiring layers of conductive traces and conductive vias for routing electrical connections between the semiconductor dies (e.g., memory modules and processors) and a system board. The interposer may include a redistribution layer (RDL) that provides a connection pattern of bond pads on the active surface of a semiconductor device (e.g., a die or chip) to a redistributed connection pattern that is more suitable for connection to the system board. In most applications, the interposer does not include active devices such as diodes and transistors.

Fabrication of wafer level package structures may include attachment of a semiconductor device (e.g., a die or chip) to the wafer level package structure. In a die split architecture, an interposer may provide die-to-die connection for enabling the die split architecture. Using an interposer to provide die-to-die connection, however, is expensive and involves a complicated process. In addition, using an interposer to provide the die-to-die connection may prevent fabrication of package structures with reduced thickness. That is, high density die-to-die connection may involve technical hurdles for fine line/space generation as well as an extra layer (e.g., an interposer) to prepare for packaging.

SUMMARY

An integrated circuit (IC) package structure may include a substrate. The substrate may include a semiconductor bridge having a first surface directly on a surface of the substrate that faces a first semiconductor die and a second semiconductor die. The semiconductor bridge may be disposed within a cavity extending through a photo-sensitive layer on the surface of the substrate. The semiconductor bridge may have an exposed, second surface substantially flush with the photo-sensitive layer. The first semiconductor die and the second semiconductor die are supported by the substrate and coupled together through the semiconductor bridge.

A method for fabricating an integrated circuit (IC) package structure may include depositing a photo-sensitive layer(s) on a surface of a substrate facing a first semiconductor die and a second semiconductor die. The method may also include etching the photo-sensitive layer to form a cavity through the photo-sensitive layer to the surface of the substrate. The method may further include placing a semiconductor bridge within the cavity and directly on the surface of the substrate. The photo-sensitive layer may contact sidewalls of the semiconductor bridge. The method may also include attaching the first die and the second die to the IC package structure. The first die and the second die may be coupled together through the semiconductor bridge.

An integrated circuit (IC) package structure may include a substrate. The substrate may include a semiconductor bridge having a first surface directly on a surface of the substrate that faces a first semiconductor die and a second semiconductor die that are supported by the substrate. The semiconductor bridge may be disposed within a cavity extending through a photo-sensitive layer on the surface of the substrate. The semiconductor bridge may have an exposed, second surface substantially flush with the photo-sensitive layer. The IC package structure may also include means for coupling the first semiconductor die and the second semiconductor die through the semiconductor bridge.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
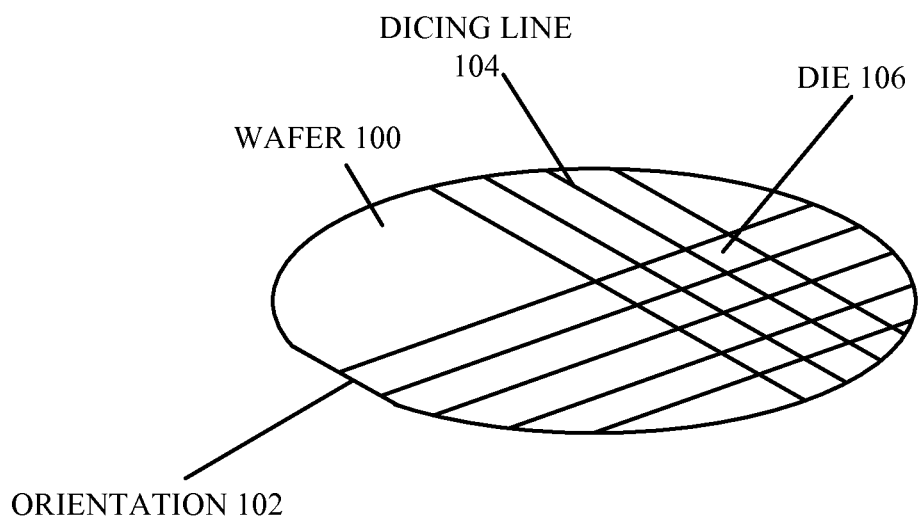
FIG. 1 illustrates a perspective view of a semiconductor wafer in an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Some described implementations relate to integrated circuit (IC) package structures that avoid the use of expensive interposer technology. An interposer generally serves as an intermediate layer that can be used for direct electrical interconnection between one component or substrate and a second component or substrate with the interposer positioned in between. For example, an interposer may have a pad configuration on one side that can be aligned with corresponding pads on a first component (e.g., a die), and a different pad configuration on a second side that corresponds to pads on a second component (e.g., a package substrate, system board, etc.) Interposers are widely used for integrating multiple chips on a single package. Interposer substrates can be composed of glass and quartz, organic, or other like material and normally contain a few interconnect layers.

Fabrication of wafer level package structures may include attachment of a semiconductor device (e.g., a die or chip) to the wafer level package structure. In a die split architecture, an interposer may be used to provide die-to-die connection for enabling the split die architecture. Using an interposer to provide die-to-die connection, however, is expensive and involves a complicated process. In addition, using an interposer to provide the die-to-die connection may prevent fabrication of package structures with reduced thickness. That is, high density die-to-die connection may involve technical hurdles for fine line/space generation as well as an extra layer (e.g., an interposer) to prepare for packaging.

Various aspects of the disclosure provide techniques for fabrication of an integrated circuit (IC) package structure. The process flow for semiconductor fabrication of the IC package structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

An IC package structure, according to aspects of the present disclosure, includes a cavity bridge connection for a die split architecture. The IC package structure may be fabricated with a multilayer photo-sensitive region. In this aspect of the disclosure, a semiconductor bridge is fabricated within a cavity of the multilayer photo-sensitive region. The semiconductor bridge provides a connection between a first die and a second die of the die split architecture.

In aspects of the disclosure, the semiconductor bridge provides die-to-die connectivity for the die split architecture of an IC package structure including a core substrate. In one configuration, a cavity is formed in the multilayer photo-sensitive region to expose a portion of a contact layer on a surface of the substrate facing the active die. In this configuration, the semiconductor bridge is disposed within the cavity and directly on the contact layer. A first photo-sensitive layer and a second photo-sensitive layer of the multilayer photo-sensitive region may directly contact the sidewalls of the semiconductor bridge, but are separate from a first layer directly on the contact layer and an exposed second layer opposite the first layer of the semiconductor bridge.

The IC package structure couples a first chip and a second chip that may be encapsulated within a molding compound through the semiconductor bridge. In addition, the first chip and the second chip may be coupled to through interconnects (e.g., front-side) of the multilayer photo-sensitive region and the contact layer. The interconnects of the contact layer may be coupled with through substrate vias to a back-side interconnect layer of the IC package structure. The back-side interconnect layer may facilitate communication between the first chip and the second chip and a first conductive interconnect (e.g., a ball grid array (BGA)).

In this arrangement, a point of interconnection process (POI) and a semiconductor bridge (e.g., a premade silicon bridge) are used to provide a die-to-die connection. The semiconductor bridge can support a fine line process because the semiconductor material (e.g., silicon (Si)) observes a fine line design that exceeds the rougher design rule of a conventional bridge. The semiconductor bridge may be configured as a thin bridge embedded structure that is easy to align for die to bridge connection due to a bridge exposed bottom package surface. The semiconductor bridge also provides an alternate solution to conventional interposers for die-to-die connection. The semiconductor bridge can easily provide a thinner package for high I/O (input/out) count die-to-die connectivity.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
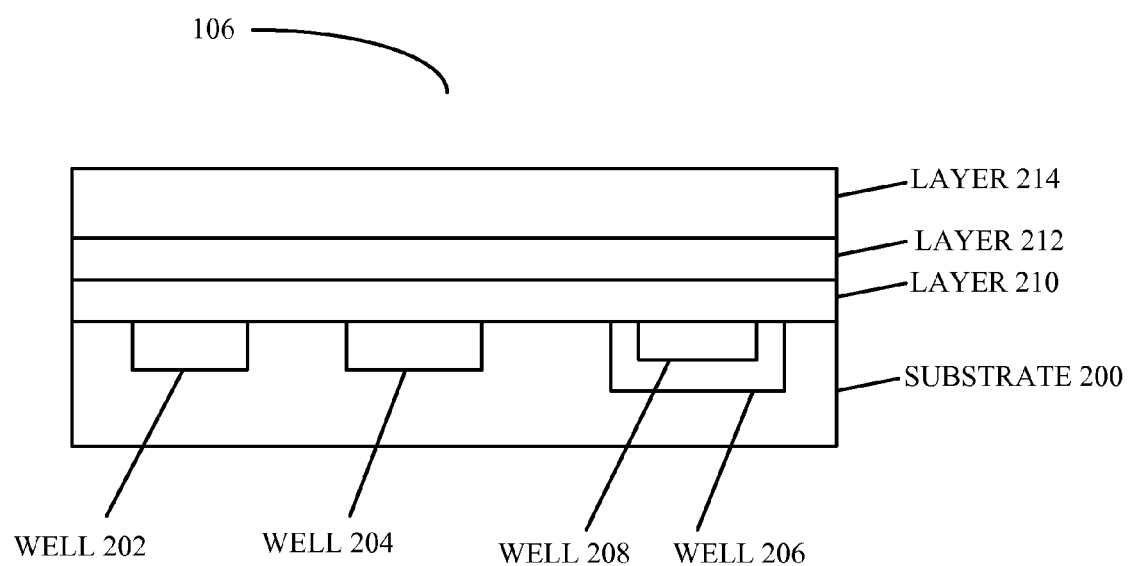
FIG. 2 illustrates a cross-sectional view of a die in accordance with an aspect of the present disclosure.

FIG. 2 illustrates a cross-sectional view of a die 106 in accordance with an aspect of the present disclosure. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
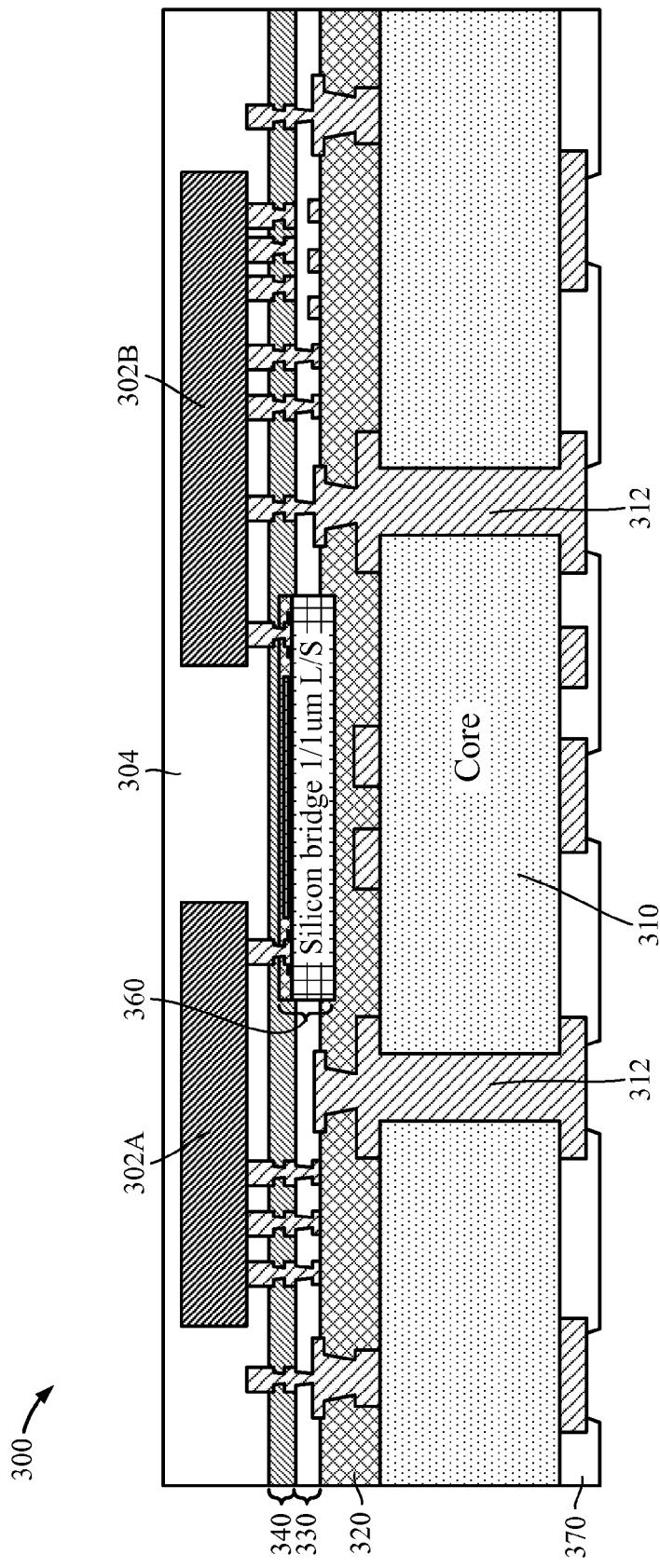
FIG. 3 illustrates an integrated circuit (IC) package structure according to aspects of the present disclosure.

FIG. 3 illustrates an integrated circuit (IC) package structure 300 according to aspects of the present disclosure. The IC package structure 300 includes a substrate 310 having a contact layer 320 on the substrate 310 and a multilayer photo-sensitive region. The substrate 310 may be of an organic material. The substrate 310 may be an epoxy-based laminate substrate having a core and/or build-up layers such as, for example, an Ajinomoto Build-up Film (ABF) substrate. For example, the contact layer 320 may be a dielectric layer, such as an ABF layer. In this configuration, the multilayer photo-sensitive region includes a first photo-sensitive layer 330 on the contact layer 320 and a second photo-sensitive layer 340 on the first photo-sensitive layer 330. The first photo-sensitive layer 330 and the second photo-sensitive layer 340 may be a multilayer material such as polybenzoxazole (PBO) or other like photo-sensitive material.

In aspects of the disclosure, a semiconductor bridge 360 provides a die-to-die connection for the die split architecture of the IC package structure 300. In one configuration, a cavity (e.g., cavity 552 of FIG. 5H) is formed in the multilayer photo-sensitive region to expose a portion of the contact layer 320. In this configuration, the semiconductor bridge 360 is disposed within the cavity and directly on the contact layer 320. The first photo-sensitive layer 330 and the second photo-sensitive layer 340 directly contact the sidewalls of the semiconductor bridge 360, but are separate from a first layer directly on the contact layer 320 and an exposed second layer opposite the first layer of the semiconductor bridge 360.

Figure 4A:
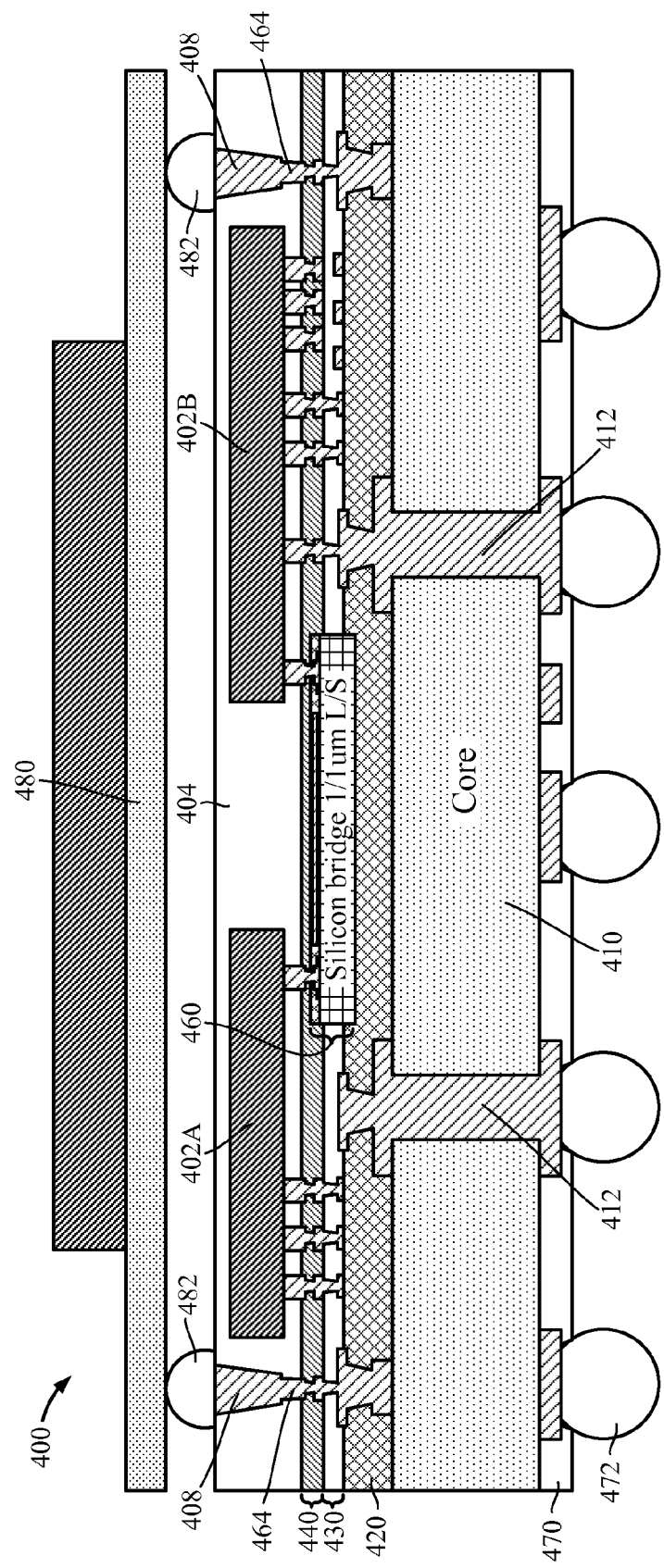
FIGS. 4A and 4B illustrate package on package (POP) arrangements of an IC package structure according to aspects of the present disclosure.
Figure 4B:
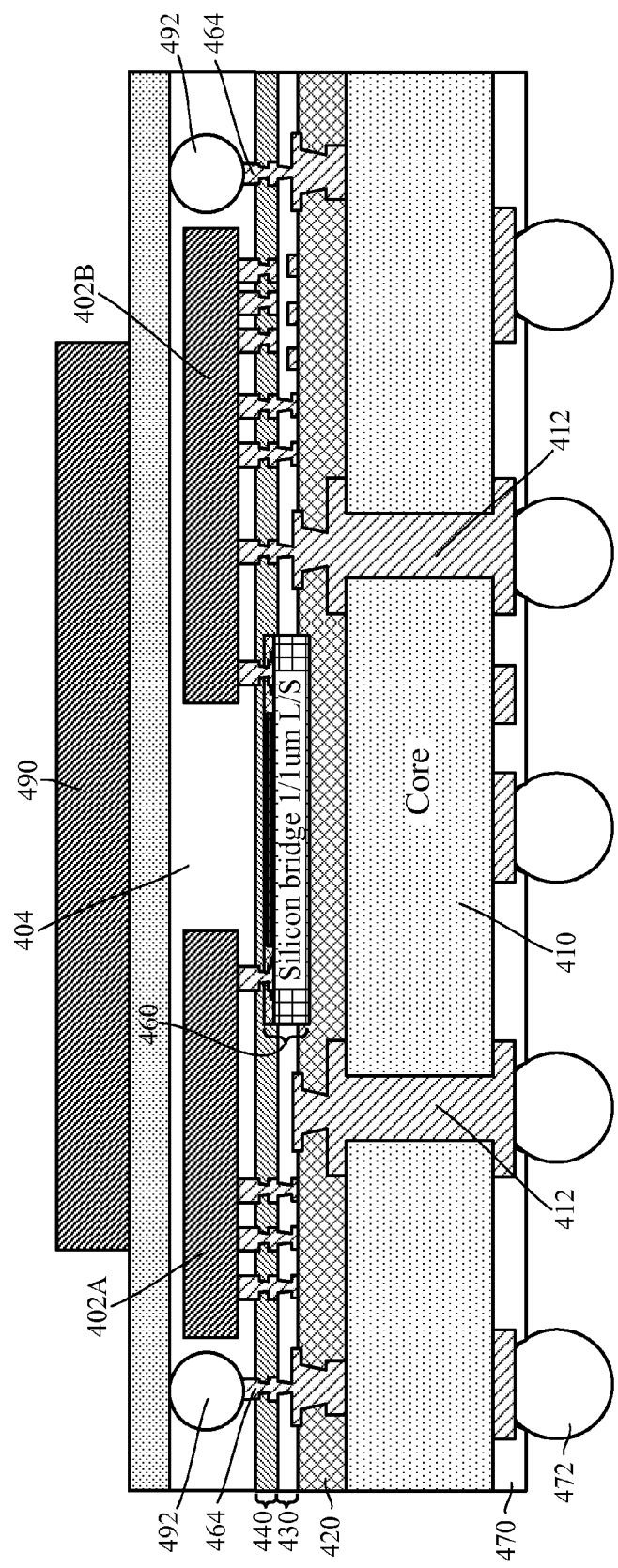

The IC package structure 300 may couple a first chip 302A and a second chip 302B encapsulated within a molding compound 304 through the semiconductor bridge 360. In addition, the first chip 302A and the second chip 302B are also coupled through interconnects (e.g., front-side) of the multilayer photo-sensitive region (e.g., 330 and 340) and the contact layer 320. The interconnects of the contact layer 320 are coupled to through substrate vias 312 to a back-side interconnect layer 370. The back-side interconnect layer 370 may facilitate communication between the first chip 302A, the second chip 302B and a first conductive interconnect (e.g., a ball grid array (BGA)), as shown in FIGS. 4A and 4B In this arrangement, a point of interconnection process (POI) and the semiconductor bridge 360 (e.g., a premade silicon bridge) are used to provide a die-to-die connection. The semiconductor bridge 360 can reduce a fine line process because the semiconductor material (e.g., silicon (Si)) observes a fine line design rule exceeding the rougher design rule of a conventional bridge. The semiconductor bridge 360 may be configured as a thin bridge embedded structure that is easy to align for die to bridge connection due to a bridge exposed bottom package surface. The semiconductor bridge 360 also provides an alternate solution to conventional interposers for die-to-die connection. The semiconductor bridge 360 can easily provide a thinner package for high I/O (input/out) count die-to-die connectivity. In this arrangement, the package structure 300 is a non-symmetric structure.

FIGS. 4A and 4B illustrate package on package (POP) arrangements of an IC package structure according to aspects of the present disclosure. FIG. 4A shows a conductive material filled via type POP structure 480 stacked on an IC package structure 400. In this arrangement, the IC package structure 400 includes a back-side conductive interconnect 472 coupled to a back-side interconnect layer 470 and a through substrate via 412. The back-side conductive interconnect 472 may couple to a system board, a package substrate or other suitable carrier substrate (not shown). The back-side conductive interconnect 472 may be configured according to a ball grid array (BGA) interconnect structure.

The IC package structure 400 also couples a first chip 402A and a second chip 402B, encapsulated within a molding compound 404, through a semiconductor bridge 460. In addition, the first chip 402A and the second chip 402B are also coupled through interconnects (e.g., front-side) of a multilayer photo-sensitive region and a contact layer 420. The multilayer photo-sensitive region includes a first photo-sensitive layer 430 on the contact layer 420 and a second photo-sensitive layer 440 on the first photo-sensitive layer 430. The interconnects of the contact layer 420 are coupled with through substrate vias 412 to the back-side interconnect layer 470. In this arrangement, front-side conductive interconnects 464 are coupled to through mold vias 408. In addition, the POP structure 480 is coupled to the through mold vias 408 through package interconnects 482.

FIG. 4B shows a microelectronic (MEP) type POP structure 490 stacked on the IC package structure 400. In this arrangement, the MEP type POP structure 490 is formed on a molding compound 404 surrounding the first chip 402A and the second chip 402B. Representatively, front-side conductive interconnects 464 are coupled to package interconnects 492. The MEP type POP structure 490 is coupled to the front-side conductive interconnects 464 through the package interconnects 492.

Figure 5A:
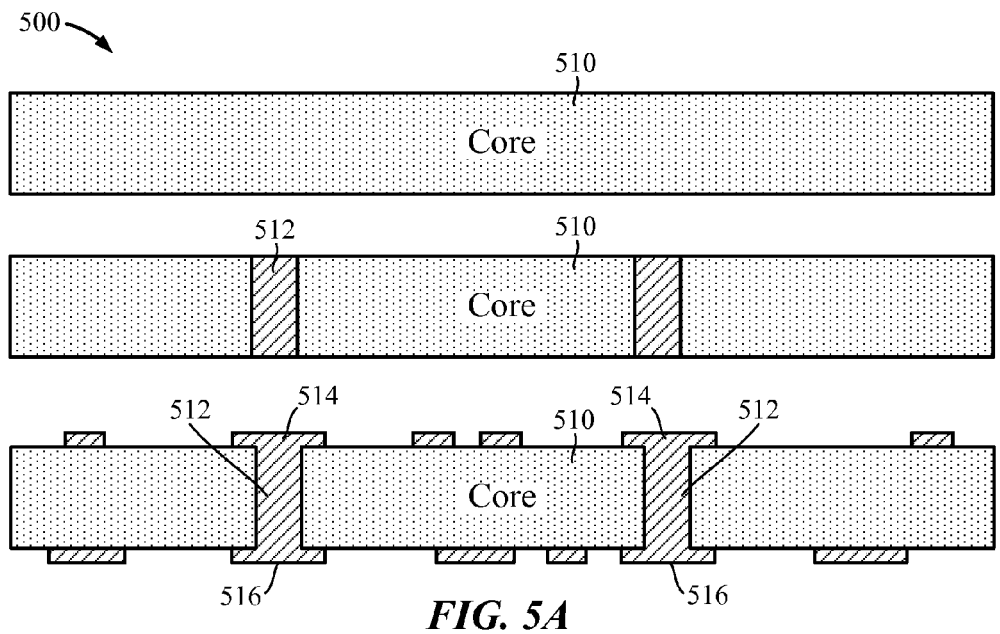
FIGS. 5A-5O illustrate an IC package structure at various stages of fabrication according to aspects of the present disclosure.
Figure 5B:
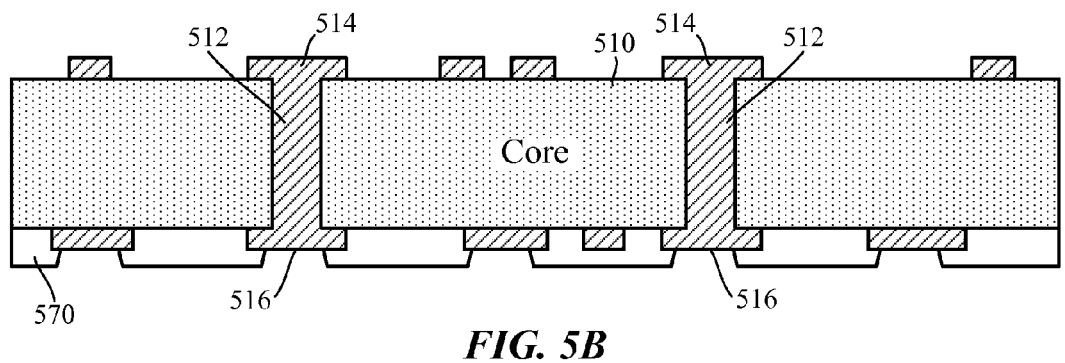

FIGS. 5A-5O illustrate an IC package structure 500 at various stages of fabrication according to aspects of the present disclosure. For example, FIGS. 5A-5L illustrate a sequential fabrication approach of the IC package structure 300 shown in FIG. 3. In addition, FIGS. 5L-5N illustrate a sequential approach for fabrication of the POP structure 480 of FIG. 4A. Similarly, FIG. 5O illustrates fabrication of the MEP type POP structure 490 of FIG. 4B.

Beginning with FIG. 5A, a substrate 510 is provided. The substrate 510 may be an epoxy-based laminate substrate having a core and/or build-up layers such as, for example, an Ajinomoto Build-up Film (ABF). Through substrate vias 512 are fabricated within the substrate 510. In addition, a conductive material (e.g., copper) may be deposited on a front-side and a back-side surfaces of the substrate 510 to form conductive contact pads 514 and 516. In this arrangement, the conductive contact pads 514 and 516 are coupled with the through substrate vias 512. Once the conductive contact pads 514 and 516 are completed, a back-side interconnect layer 570 (e.g., a solder resist build-up layer) may deposited on the back-side surface of the substrate 510, as shown in FIG. 5B.

Figure 5C:
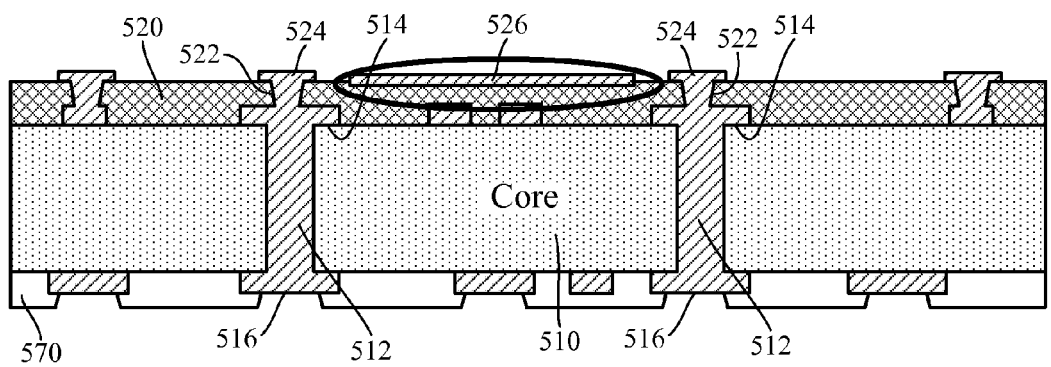

In FIG. 5C, a contact layer 520 is fabricated on the front-side surface of the substrate 510. For example, the contact layer 520 may be a dielectric layer, such as an ABF layer or other like dielectric layer. In this example, the contact layer 520 is fabricated using a dielectric material lamination process. In addition, conductive contacts within the contact layer 520 may be formed using a semi-additive process (SAP) to form a solid conductive material (e.g., copper) plane. In this arrangement, conductive vias 522 are formed to couple conductive contact pads 524 to the through substrate vias 512. As described herein, the conductive contacts may include the conductive vias 522 and the conductive contact pads 524. In addition, a conductive trace 526 identifies a portion of the contact layer 520 that will support a semiconductor bridge.

In FIG. 5D, a first layer of a multilayer photo-sensitive region is deposited on the contact layer 520. The multilayer photo-sensitive region may be composed of one or more layers of a photo-dielectric material, such as polybenzoxazole (PBO) or other like photo-imageable dielectric (PID) material. The deposited photo-dielectric material may be subjected to a photo process to form a first photo-sensitive layer 530. In this arrangement, via openings 532 are fabricated within the first photo-sensitive layer 530 to expose the conductive contact pads 524 on the contact layer 520. In addition, a trench opening 534 exposes the conductive trace 526 that identifies the portion of the contact layer 520 that will support the semiconductor bridge.

In FIG. 5E, the via openings 532 and the trench opening 534 are filled with a conductive material (e.g., copper) to form conductive vias 536 and a conductive trench 538.

In FIG. 5F, a second layer of the multilayer photo-sensitive region is deposited on the first photo-sensitive layer 530. In this arrangement, a deposited photo-dielectric material may be subjected to a photo process to form a second photo-sensitive layer 540 on the first photo-sensitive layer 530. In this arrangement, via openings 542 are fabricated within the second photo-sensitive layer 540 to expose conductive contact pads 539 on the first photo-sensitive layer 530. In addition, a trench opening 544 exposes the conductive trench 538 that identifies the portion of the contact layer 520 that will support the semiconductor bridge.

Figure 5G:
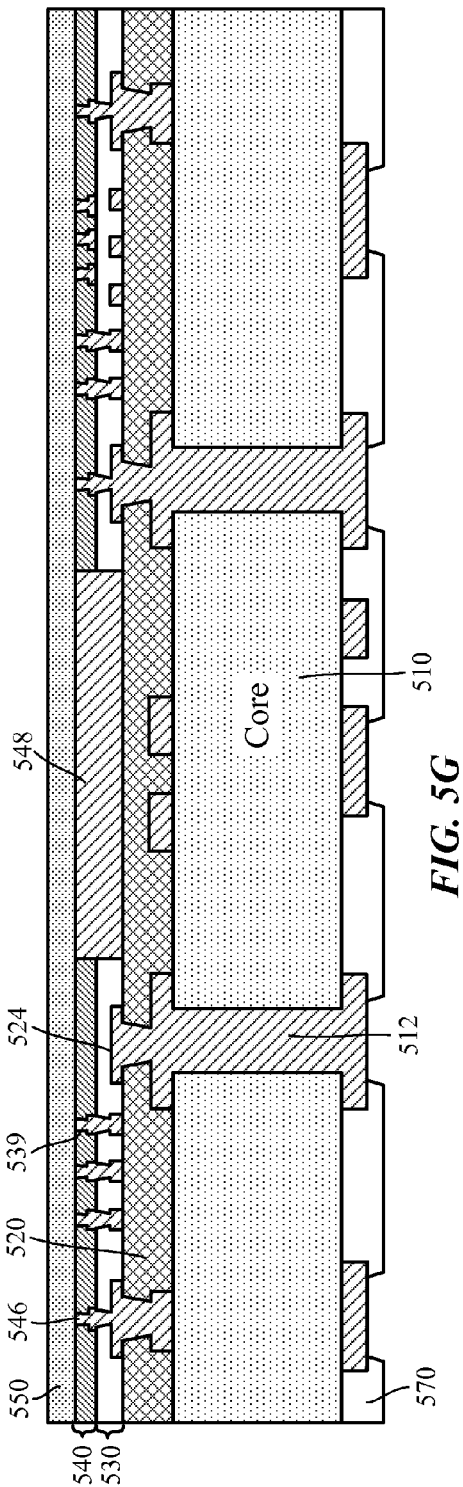

In FIG. 5G, the via openings 542 and the trench opening 544 are filled with a conductive material (e.g., copper) to form conductive vias 546 and a conductive trench 548. The conductive material is deposited within the via openings 542 and the trench opening 544 on the exposed portions of conductive contact pads 539 and the conductive trench 538. In this arrangement, a photoresist 550 is coated on the second photo-sensitive layer 540, the conductive vias 546 and the conductive trench 548.

Figure 5H:
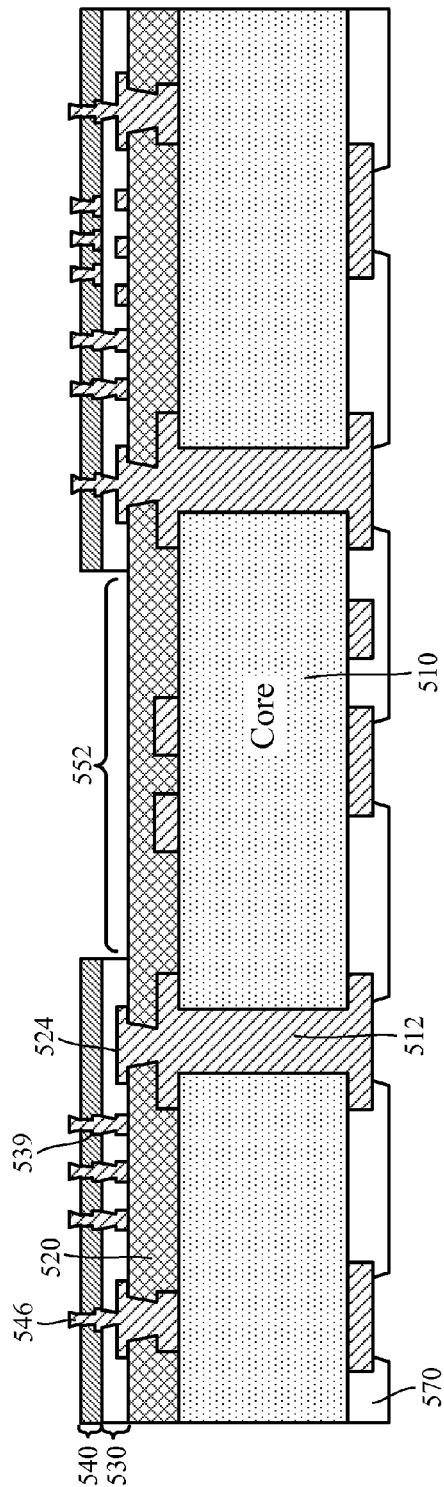

In FIG. 5H, the photoresist 550 is removed from the second photo-sensitive layer 540 to expose the conductive vias 546. In this arrangement, the conductive trench 548 is etched to expose the contact layer 520 to form a cavity 552. The cavity 552 is provided to support a semiconductor bridge, for example, as shown in FIG. 5J.

Figure 5I:
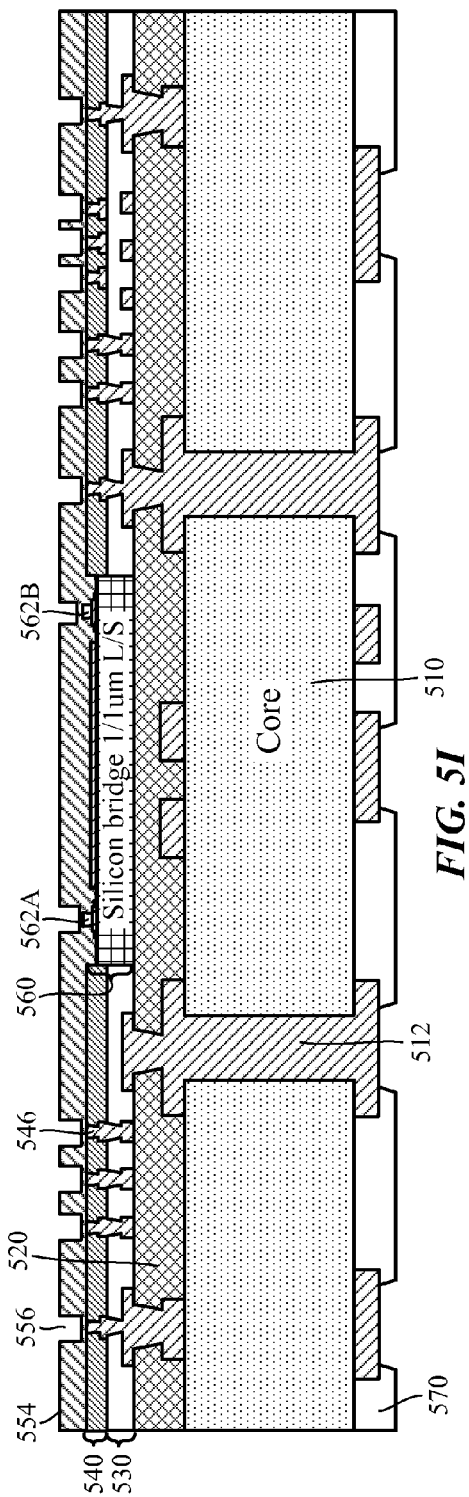

In FIG. 5I, a semiconductor bridge 560 is placed on the exposed portion of the contact layer 520 within the cavity 552. In this arrangement, sidewalls of the semiconductor bridge 560 are contacted by the first photo-sensitive layer 530 and the second photo-sensitive layer 540 of the multilayer photo-sensitive region. In this configuration, the multilayer photo-sensitive region does not contact a first surface of the semiconductor bridge 560 that is placed on the exposed portion of the contact layer 520 within the cavity 552. In addition, a second surface of the semiconductor bridge 560, opposite the first surface is exposed and separate from the multilayer photo-sensitive region. That is, the semiconductor bridge 560 is embedded within the cavity 552, such that the exposed surface of the semiconductor bridge 560 is substantially flush with and within the cavity 552.

As further shown in FIG. 5I, a photoresist 554 is coated on the second photo-sensitive layer 540, the conductive vias 546 and the exposed surface of the semiconductor bridge 560. Once coated, the photoresist 554 is opened to form openings 556 exposing portions of the conductive vias 546 and contacts 562 (562A and 562B) of the semiconductor bridge 560. In this arrangement, the opening 556 define front-side conductive interconnects, for example, as shown in FIG. 5J.

Figure 5J:
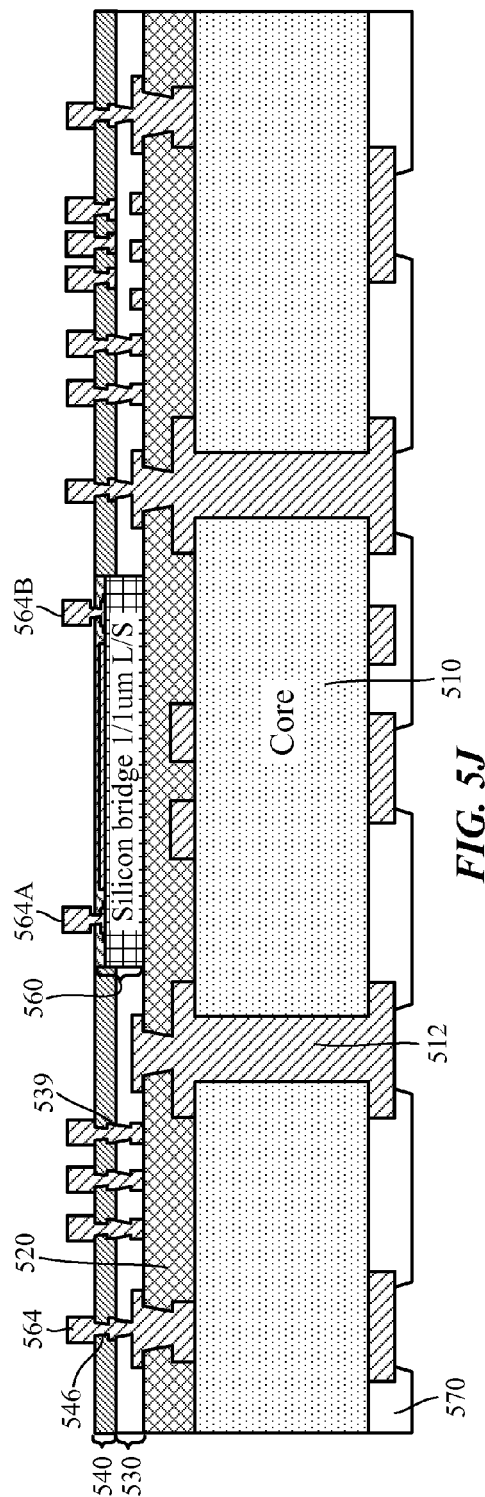

In FIG. 5J, the opening 556 formed within the photoresist 554 are plated with a conductive material to form front-side conductive interconnects 564. In this arrangement, the front-side conductive interconnects 564 are shown as conductive posts, but other arrangements of the front-side conductive interconnects 564 are possible according to aspects of the present disclosure. Representatively, a first conductive interconnect 564A and a second conductive interconnect 564B to the contacts 562 (562A and 562B) of the semiconductor bridge 560 enable die-to-die connection for a die split architecture, for example, as shown in FIG. 5K.

Figure 5K:
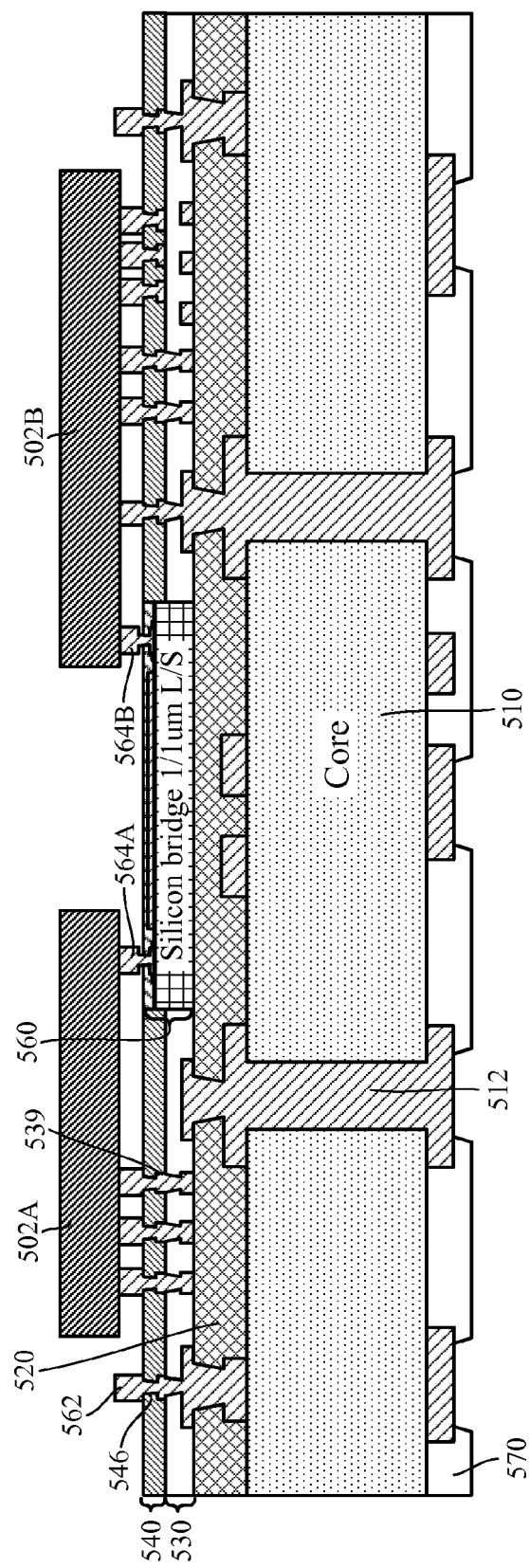
Figure 5L:
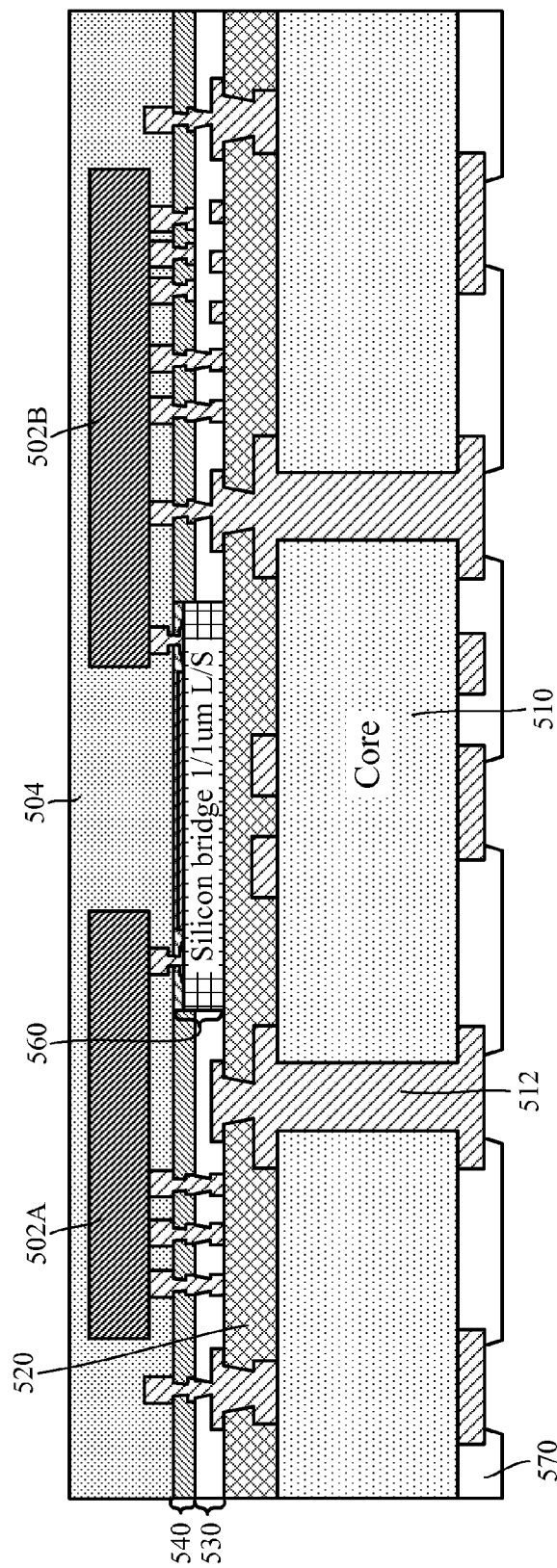
Figure 5M:
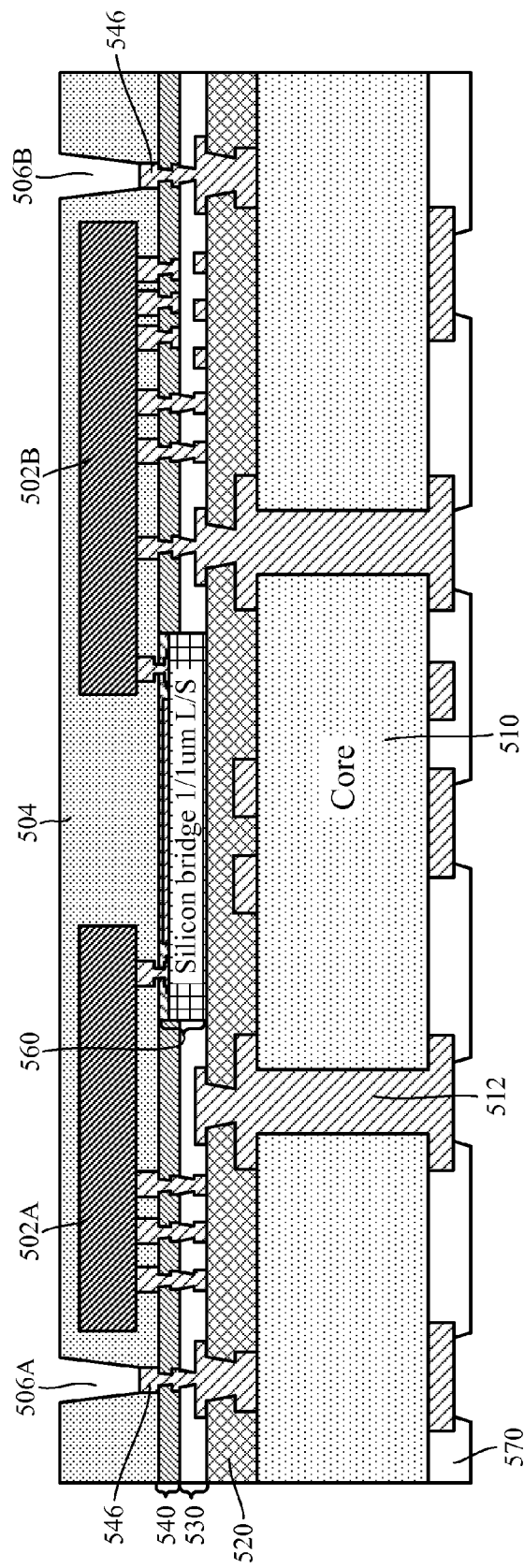
Figure 5N:
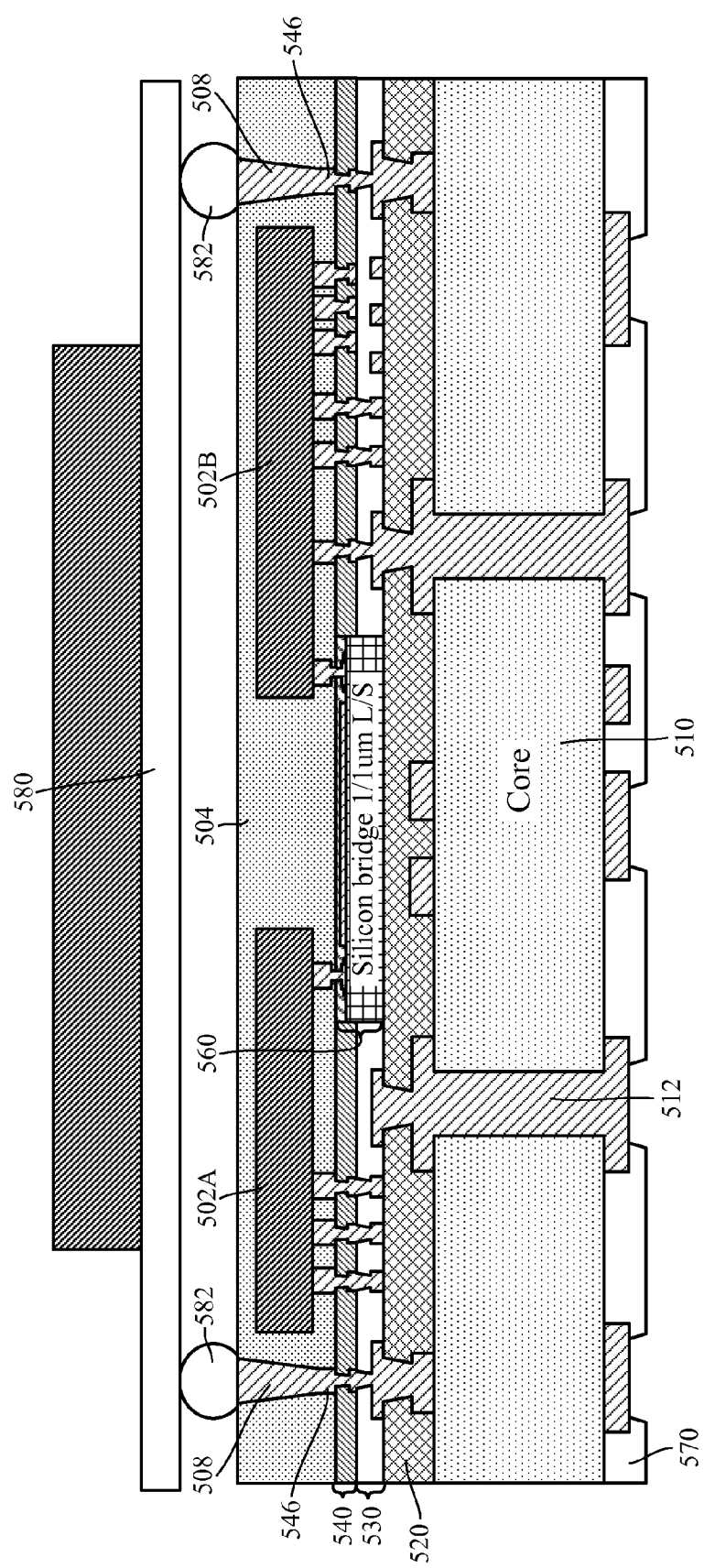
Figure 50:
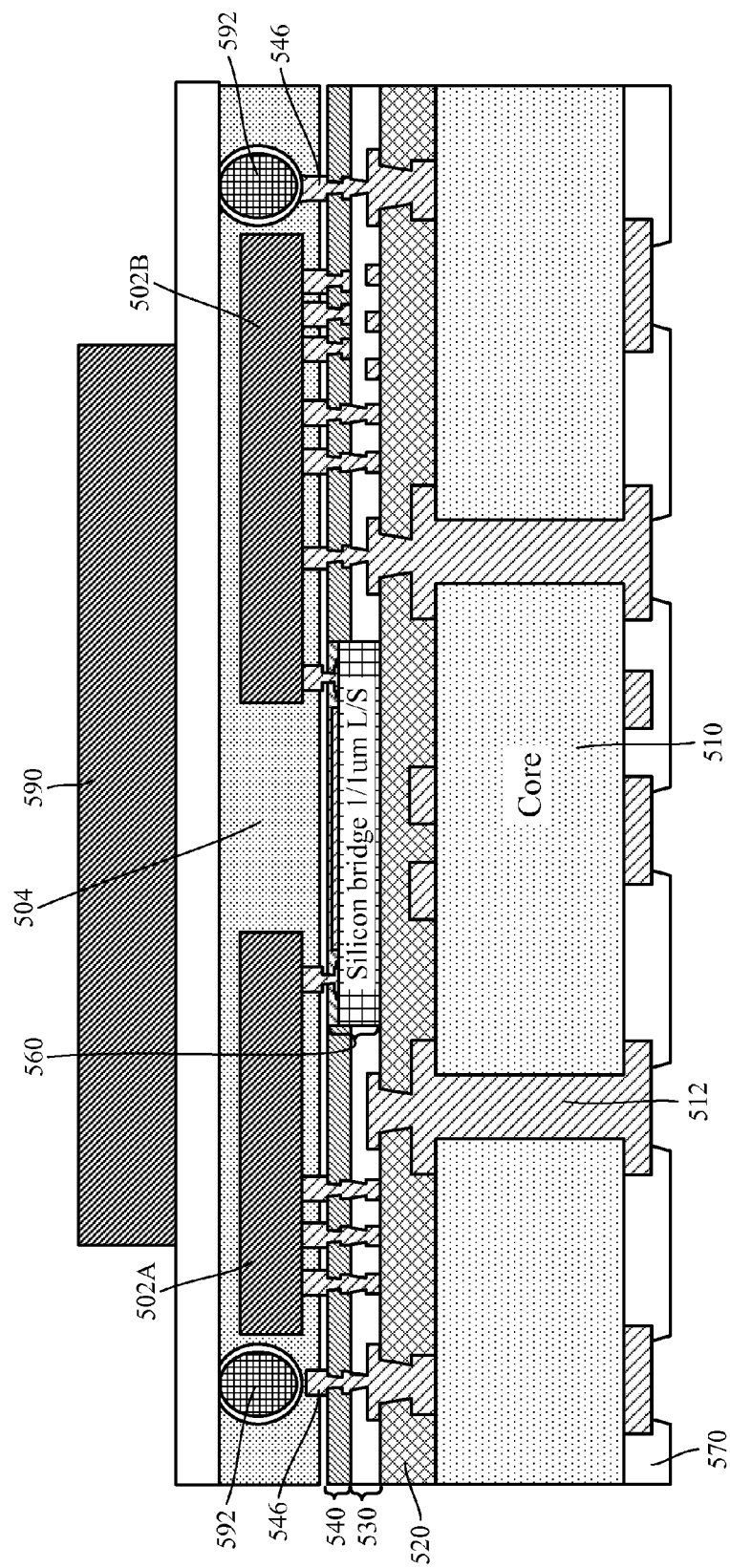

In FIG. 5K, a first die 502A and a second die 502B are coupled to the front-side conductive interconnects 564. In addition, the first conductive interconnect 564A and the second conductive interconnect 564B provide the die-to-die connection for the first die 502A and the second die 502B through the semiconductor bridge 560.

In FIG. 5L, the IC package structure 500 is prepared for a package on package process by encapsulating the first die 502A and the second die 502B within a molding compound 504. Once encapsulated, in FIG. 5M, through mold via openings 506A and 506B are opened within the molding compound 504 to selected ones of the front-side conductive interconnects 564. In FIG. 5N, the through mold via openings 506A and 506B are plated with a conductive material to form through mold vias 508. Next, first POP structure 580 is attached to the through mold vias 508 through first conductive interconnects 582. Although shown as solder ball type interconnections, other types of interconnects may be used to attach the first POP structure 580 to the through mold vias 508.

In FIG. 5O, a microelectronic (MEP) type POP structure 590 is stacked on the IC package structure 500 and coupled to the selected ones of the front-side conductive interconnects 564 using second conductive interconnects 592. In addition, an underfill process may be performed to secure the MEP type POP 590 stacked on the IC package structure 500.

FIGS. 4A and 4B illustrate POP arrangements of the IC package structures of FIGS. 5L and 5M according to aspects of the present disclosure. In these arrangements, the IC package structure 400/500 includes a back-side conductive interconnect 472 coupled to the back-side interconnect layer 470/570 and the through substrate vias 412/512. The back-side conductive interconnect 472 may couple a system board, a package substrate or other suitable carrier substrate (not shown). The back-side conductive interconnect 472 may be configured according to a ball grid array (BGA) interconnect structure.

Figure 6:
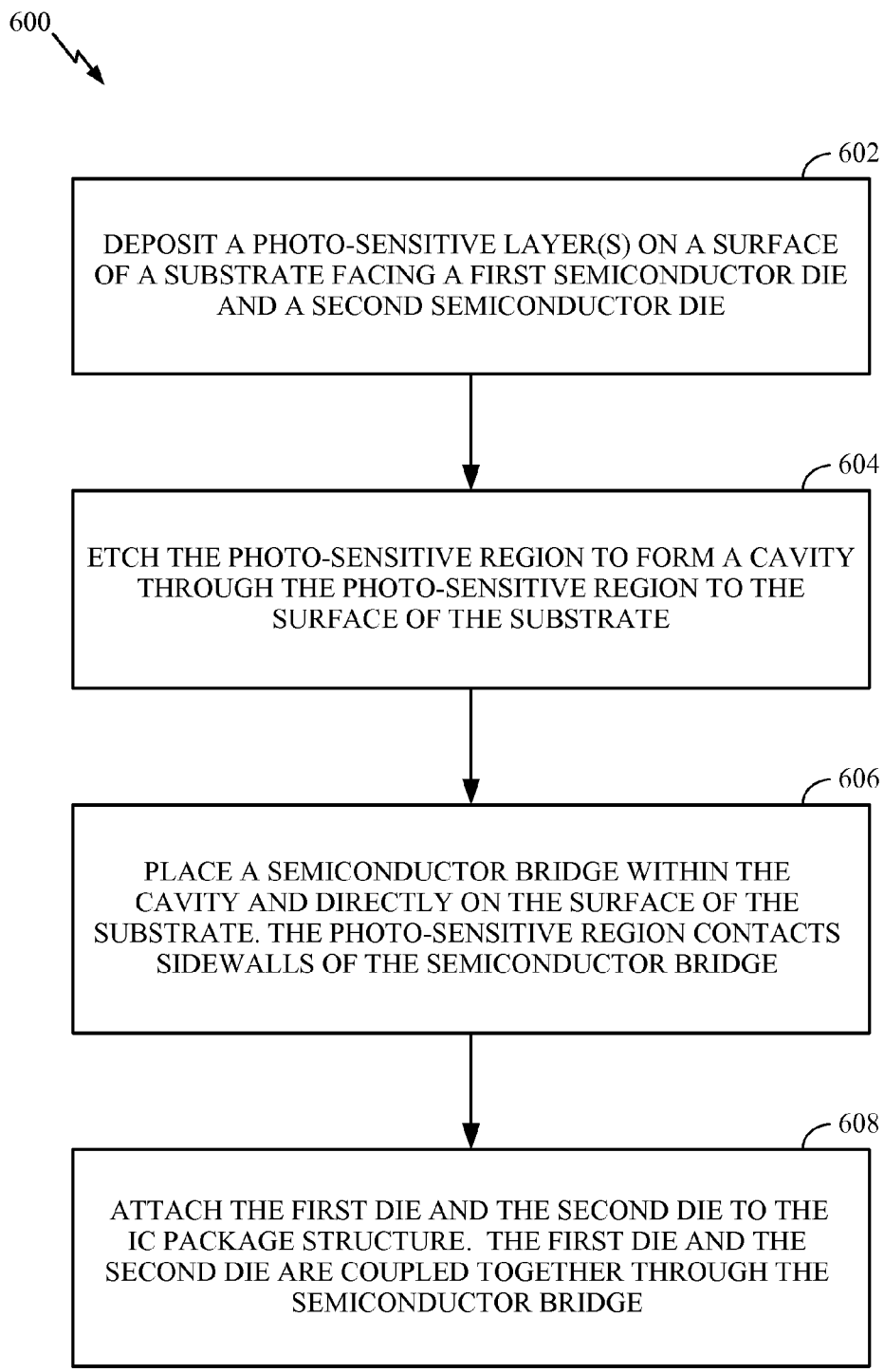
FIG. 6 is a process flow diagram illustrating a method for fabricating a cavity bridge connection for a die split architecture according to aspects of the present disclosure.

FIG. 6 is a flow diagram illustrating a method 600 for fabricating a cavity bridge connection for a die split architecture according to one aspect of the disclosure. At block 602, a photo-sensitive layer is deposited on a surface of a substrate facing a first semiconductor die and a second semiconductor die. For example, a multilayer photo-sensitive region includes a first photo-sensitive layer 530 on a contact layer 520 and a second photo-sensitive layer 540 on the first photo-sensitive layer 530, as shown in FIGS. 5D to 5F. At block 604, the photo-sensitive region is etched to form a cavity through the photo-sensitive region to the surface of the substrate. For example, as shown in FIG. 5H, the second photo-sensitive layer 540 and the first photo-sensitive layer 530 are etched to expose a portion of the contact layer 520 to form a cavity 552.

Referring again to FIG. 6, at block 606, a semiconductor bridge is placed within the cavity and directly on the surface of the substrate, with the photo-sensitive region contacting sidewalls of the semiconductor bridge. For example, as shown in FIG. 5I, the semiconductor bridge 560 is placed directly on the contact layer 520 of the substrate 510. Because the cavity extends through both layers of the multilayer photo-sensitive region to the contact layer 520, the first photo-sensitive layer 530 and the second photo-sensitive layer 540 contact only the sidewalls of the semiconductor bridge 560. In block 608, the first die and the second die are attached to the IC package structure. In this arrangement, the first die and the second die are coupled together through the semiconductor bridge. For example, as shown in FIG. 5K, the first die 502A and the second die 502B are coupled to the front-side conductive interconnects 564. In addition, the first conductive interconnect 564A and the second conductive interconnect 564B provide the die-to-die connection for the first die 502A and the second die 502B through the semiconductor bridge 560.

In one configuration, an IC package structure includes a cavity bridge connection for a die split architecture. The cavity bridge connection may be a semiconductor bridge disposed within a cavity extending through a photo-sensitive layer on a surface of a substrate. The IC package structure may include a means for coupling a first die and a second die through the semiconductor bridge. In one aspect of the disclosure, the coupling means is the first conductive interconnect 564A and the second conductive interconnect 564B to the contacts 562 (562A and 562B) of the semiconductor bridge 560 for enabling die-to-die connection for a die split architecture, as shown in FIG. 5K, configured to perform the functions recited by the coupling means. In another aspect, the aforementioned means may be a device or any layer configured to perform the functions recited by the aforementioned means.

An IC package structure, according to aspects of the present disclosure, includes a cavity bridge connection for a die split architecture. The IC package structure may be fabricated with a multilayer photo-sensitive region. In this aspect of the disclosure, a semiconductor bridge is fabricated within a cavity of the multilayer photo-sensitive region. The semiconductor bridge provides a connection between a first die and a second die of the die split architecture.

In aspects of the disclosure, the semiconductor bridge provides die-to-die connection for the die split architecture of an IC package structure including a core substrate. In one configuration, a cavity is formed in the multilayer photo-sensitive region to expose a portion of a contact layer on a surface of the substrate facing the active die. In this configuration, the semiconductor bridge is disposed within the cavity and directly on the contact layer. A first photo-sensitive layer and a second photo-sensitive layer of the multilayer photo-sensitive region may directly contact the sidewalls of the semiconductor bridge, but are separate from a first layer directly on the contact layer and an exposed second layer opposite the first layer of the semiconductor bridge.

The IC package structure couples a first chip and a second chip that may be encapsulated within a molding compound through the semiconductor bridge. In addition, the first chip and the second chip may be coupled through interconnects (e.g., front-side) of the multilayer photo-sensitive region and the contact layer. The interconnects of the contact layer may be coupled with through substrate vias to a back-side interconnect layer of the IC package structure. The back-side interconnect layer may facilitate communication between the first chip and the second chip and a first conductive interconnect (e.g., a ball grid array (BGA)).

Figure 7:
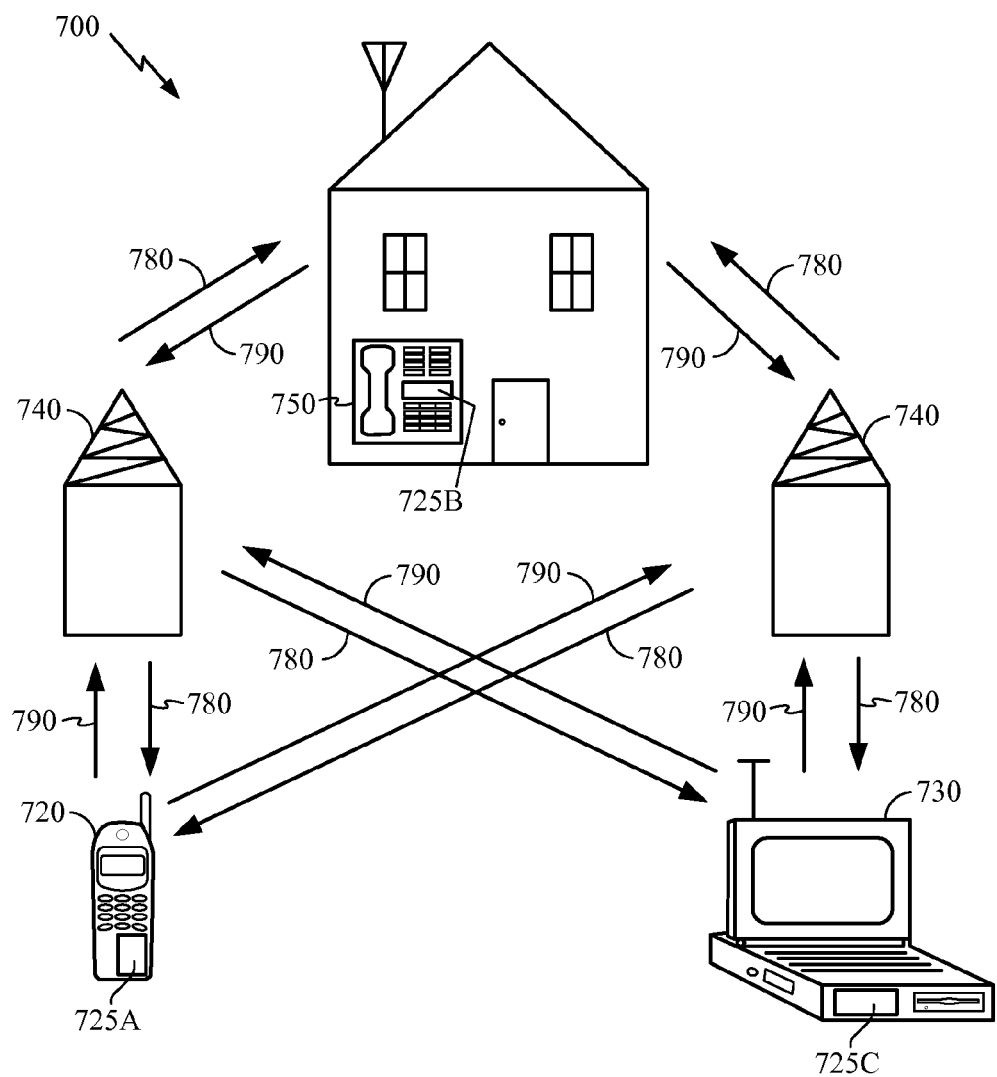
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed IC package structure. It will be recognized that other devices may also include the disclosed IC package structure, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units 720, 730, and 750 may be a mobile phone, hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or communications device that stores or retrieves data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed devices.

Figure 8:
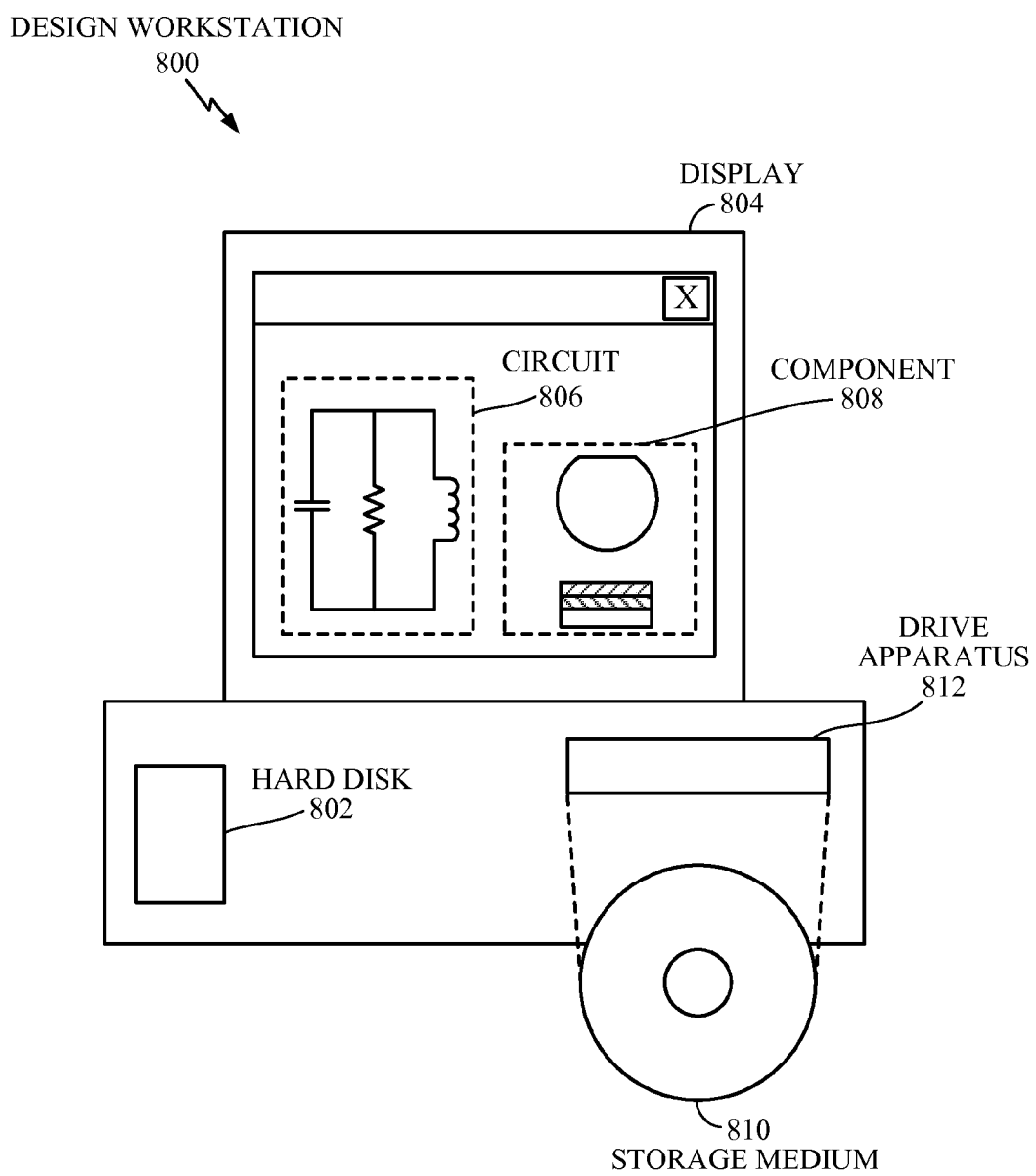
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the devices disclosed above. A design workstation 800 includes a hard disk 802 containing operating system software, support files, and design software such as Cadence or OrCAD. The design workstation 800 also includes a display 804 to facilitate design of a circuit 806 or a semiconductor component 808 such as an IC package structure. A storage medium 810 is provided for tangibly storing the design of the circuit 806 or the semiconductor component 808. The design of the circuit 806 or the semiconductor component 808 may be stored on the storage medium 810 in a file format such as GDSII or GERBER. The storage medium 810 may be a CD-ROM, DVD, hard disk, flash memory, or other appropriate device. Furthermore, the design workstation 800 includes a drive apparatus 812 for accepting input from or writing output to the storage medium 810.

Data recorded on the storage medium 810 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 810 facilitates the design of the circuit 806 or the semiconductor component 808 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "a step for."

What is claimed is:

1. An integrated circuit (IC) package structure, comprising:
   a substrate;
   a semiconductor bridge having a first surface directly on a surface of the substrate facing a first semiconductor die and a second semiconductor die, the semiconductor bridge disposed within a cavity extending through a photo-sensitive layer on the surface of the substrate and having an exposed, second surface substantially flush with the photo-sensitive layer; and
   the first semiconductor die and the second semiconductor die supported by the substrate and coupled together through the semiconductor bridge.

2. The integrated circuit package structure of claim 1, in which the substrate further comprises a contact layer including a dielectric layer on a core substrate and at least one conductive contact surrounded by the dielectric layer.

3. The integrated circuit package structure of claim 1, in which the photo-sensitive layer comprises a multilayer photo-sensitive region including layers of a photo-imageable dielectric (PID) material.

4. The integrated circuit package structure of claim 3, in which the PID material comprises polybenzoxazole (PBO).

5. The integrated circuit package structure of claim 1 in which the substrate is a non-symmetric structure including a solder resist build-up layer opposite the surface of the substrate facing the first semiconductor die and the second semiconductor die.

6. The integrated circuit package structure of claim 1, in which the photo-sensitive layer directly contacts sidewalls of the semiconductor bridge.

7. The integrated circuit package structure of claim 1, in which the substrate comprises an Ajinomoto Build-up Film (ABF) substrate.

8. The integrated circuit package structure of claim 1, in which a package is coupled to a molding compound surrounding the first semiconductor die and the second semiconductor die.

9. The integrated circuit package structure of claim 1, in which a package is directly stacked on a molding compound surrounding the first semiconductor die and the second semiconductor die.

10. The integrated circuit package structure of claim 1, incorporated into at least one of a music player, a video player, an entertainment unit, a navigation device, a communications device, a personal digital assistant (PDA), a fixed location data unit, and a computer.

11. An integrated circuit (IC) package structure, comprising:
    a substrate;
    a semiconductor bridge having a first surface directly on a surface of the substrate facing a first semiconductor die and a second semiconductor die supported by the substrate, the semiconductor bridge disposed within a cavity extending through a photo-sensitive layer on the surface of the substrate and having an exposed, second surface substantially flush with the photo-sensitive layer; and
    means for coupling the first semiconductor die and the second semiconductor die through the semiconductor bridge.

12. The integrated circuit package structure of claim 11, in which the substrate further comprises a contact layer including a dielectric layer on a core substrate and at least one conductive contact surrounded by the dielectric layer.

13. The integrated circuit package structure of claim 11, in which the photo-sensitive layer comprises a multilayer photo-sensitive region including layers of a photo-imageable dielectric (PID) material.

14. The integrated circuit package structure of claim 13, in which the PID material comprises polybenzoxazole (PBO).

15. The integrated circuit package structure of claim 11 in which the substrate is a non-symmetric structure including a solder resist build-up layer opposite the surface of the substrate facing the first semiconductor die and the second semiconductor die.

16. The integrated circuit package structure of claim 11, in which the photo-sensitive layer directly contacts sidewalls of the semiconductor bridge.

17. The integrated circuit package structure of claim 11, in which the substrate comprises an Ajinomoto Build-up Film (ABF) substrate.

18. The integrated circuit package structure of claim 11, in which a package is coupled to a molding compound surrounding the first semiconductor die and the second semiconductor die.

19. The integrated circuit package structure of claim 11, in which a package is directly stacked on a molding compound surrounding the first semiconductor die and the second semiconductor die.

20. The integrated circuit package structure of claim 11, incorporated into at least one of a music player, a video player, an entertainment unit, a navigation device, a communications device, a personal digital assistant (PDA), a fixed location data unit, and a computer.

* * * * *